US009101051B1

United States Patent
Ferrara et al.

(10) Patent No.: US 9,101,051 B1
(45) Date of Patent: Aug. 4, 2015

(54) FLUSH MOUNTING UTILITY COMPONENT ASSEMBLY

(71) Applicants: Steve Ferrara, Camarillo, CA (US); Chris Nelson, Los Angeles, CA (US); Edward Caldwell, Redondo Beach, CA (US)

(72) Inventors: Steve Ferrara, Camarillo, CA (US); Chris Nelson, Los Angeles, CA (US); Edward Caldwell, Redondo Beach, CA (US)

( * ) Notice: Subject to any disclaimer, the term of this patent is extended or adjusted under 35 U.S.C. 154(b) by 300 days.

(21) Appl. No.: 13/780,407

(22) Filed: Feb. 28, 2013

Related U.S. Application Data

(60) Provisional application No. 61/618,816, filed on Apr. 1, 2012.

(51) Int. Cl.
| | | |
|---|---|---|
| *H02B 1/30* | (2006.01) | |
| *H05K 5/03* | (2006.01) | |
| *H02B 1/40* | (2006.01) | |
| *H05K 5/02* | (2006.01) | |
| *H05K 13/00* | (2006.01) | |

(52) U.S. Cl.
CPC .............. *H05K 5/0217* (2013.01); *H05K 13/00* (2013.01)

(58) Field of Classification Search
USPC .................................. 174/61, 63, 66, 67, 480
See application file for complete search history.

(56) References Cited

U.S. PATENT DOCUMENTS

| | | | | | |
|---|---|---|---|---|---|
| 5,073,681 | A | * | 12/1991 | Hubben et al. | 174/66 |
| 6,908,003 | B2 | * | 6/2005 | Feyes et al. | 220/3.2 |
| 8,445,780 | B1 | * | 5/2013 | Robins | 174/67 |
| 2005/0181675 | A1 | * | 8/2005 | Kim | 439/652 |
| 2005/0257951 | A1 | * | 11/2005 | Xu et al. | 174/66 |
| 2006/0005989 | A1 | * | 1/2006 | Swiencicki et al. | 174/66 |
| 2011/0259634 | A1 | * | 10/2011 | Alderson et al. | 174/480 |

* cited by examiner

*Primary Examiner* — Timothy Thompson
*Assistant Examiner* — Sherman Ng
(74) *Attorney, Agent, or Firm* — JW Ausley Services; James W. Ausley

(57) ABSTRACT

A utility component mounting assembly configured to be assembled and installed during building construction or remodeling and to provide access to a variety of residential, commercial, and/or industrial utilities in a manner that is unobtrusive and aesthetically appealing. In some aspects, the utility component mounting assembly is assembled and installed such that there is little or no outward protrusion of any portion of the assembly from a generally planar wall surface. The assembly provides the ability to apply the same final finishing materials to exposed portions of the assembly as to adjacent wall material. The assembly can be readily installed with existing building constructions materials, tools, and skills. The assembly can be mounted in flexible locations on a wall and in a vertical or horizontal orientation.

20 Claims, 11 Drawing Sheets

FLUSH MOUNTING UTILITY COMPONENT ASSEMBLY

RELATED APPLICATIONS

This application claims the benefit of U.S. Provisional Application 61/618,816 filed Apr. 1, 2012 entitled "Flush Mount Box with Plaster Ring and Plate" which is incorporated herein in its entirety by reference.

BACKGROUND

1. Field of the Invention

This application relates to the field of building construction and to apparatus and methods for mounting one or more utility components in a low-profile or flush mounted configuration.

2. Prior Art

New building construction and/or remodeling typically includes providing utility components at various locations within the building. Utility components are frequently located at external surfaces of interior and/or exterior vertical walls. Utility components allow an owner/user of the building to access and utilize the associated utility and/or functionality. For example, electrical power can be provided from an electrical utility service and associated utility components, which can include electrical receptacles, allow a user to connect electrical appliances to the receptacle to receive power.

Other types of utility components can include connections for satellite and/or cable services. An appropriate coaxial or fiberoptic cable can be provided to convey video signals to the building from an external cable service or a remotely located satellite receiver. The video signals allow a user to access desired video data, such as television or movie content and an associated utility component provides an access connection for the user. Similarly, a utility component can transceive digital data to allow a user to access remote networked services, such as Internet services.

Utility components can also be provided to allow a user to remotely control or actuate various appliances and/or devices. For example, a utility component can include a light switch configured to allow a user to turn an associated lighting fixture off and on. A utility component can also include a dimmer switch configured to allow a user to vary light output from one or more associated lighting fixtures. It will be understood that a wide variety of utility components can be desired and installed depending on the requirements of particular applications including, but limited to, volume controls for audio equipment, keypads or controls for security systems, lighting fixtures, charging stations for rechargeable batteries, ground fault interruption (GFI) outlet, and convenience outlet.

Utility components are often mounted to be accessible at exposed surfaces of interior and exterior wall surfaces of the building. Connecting wiring, cabling, etc. can be connected to the utility component and extend elsewhere within the building. Connecting wiring and cabling is generally routed within the structure of the building during the new construction process or at time of remodeling. Placing wiring and cabling within the structure of the building isolates the wiring and cabling from undesired contact with occupants of the building which could damage the wiring and/or cabling and impair the functionality of the associated utility as well as potentially cause injury to the occupants. Concealing wiring and cabling within the structure of the building also obscures the wiring and cabling from view and provides a generally desired aesthetic effect.

Utility components are generally positioned and installed to provide easy access for the occupants using the associated utility. The utility component is generally secured to underlying physical support structure of the building. Frequently an opening or relief is formed or provided in wall material during or before the construction process and the utility component extends through the opening or relief. Traditionally, utility components protrude to some degree from an outer or exposed surface of the wall. Utility components have also traditionally had a different appearance that surrounding wall material. For example, a utility component is typically made of a different material than surrounding wall material, is of a different color than the surrounding wall material, and/or is finished with different surface finishes that an adjacent wall material.

However, these aspects of traditional utility components and their associated installation have undesired aspects in certain applications. By protruding beyond the surface of a wall where it is mounted, a utility component is more subject to undesired contact with occupants and moving objects. If unintended contact is forceful enough, damage to the utility component and/or injury to the occupant can occur. Protruding utility components also pose the possibility of collision and damage with other appliances used in the building. For example, a typical electrical outlet that is mounted relatively low on a building wall may be impacted by a vacuum cleaner used within the building causing disruption of the vacuuming operation and potentially incurring damage to the utility component and/or other appliance.

SUMMARY

The invention is based at least in part on an understanding that there is a long unsatisfied need for improved configurations of utility component mounting assemblies and associated installation methods. Embodiments of the invention provide utility component mounting assemblies and elements thereof that are configured to mount substantially flush with wall material. Embodiments provide the advantage that existing building construction materials and techniques can be employed to mount the inventive utility component mounting assemblies such that there is little to no protrusion of the utility component mounting assemblies from installed wall material. Embodiments provide the advantage that installed utility component mounting assemblies can be finished with the same finish materials as are used with the wall material. Embodiments provide the advantage of substantially matching color and texture of finish material applied to embodiments of utility component mounting assemblies with adjacent wall material. Embodiments of utility component mounting assemblies and installation methods thereof result in a relatively unobtrusive contour and appearance that more fully blends in with the appearance of adjacent wall material to provide a more appealing appearance and more functional utility. Embodiments provide relatively inexpensive utility component mounting assemblies that can be readily and quickly installed in flexibly located mounting locations using installation methods that are readily understood and employ existing materials and skills.

One embodiment includes a utility component mounting assembly comprising a mounting support configured for direct attachment to one or more internal structural support members; an adapter configured for direct attachment to the mounting support and comprising an outwardly extending annular flange defining a finishing plane and a finishing plate abutting and extending laterally from all sides of the annular flange such that, in combination, the annular flange and finishing plate provide clearance for application of finishing material on an outer surface of the finishing plate and to an outer surface of the annular flange so as to be substantially flush with the finishing plane, the finishing plate having at least one structural feature configured to retain the finishing material and such that the adapter provides clearance for a sheet of wall material to be interposed between the mounting support and an inner surface of the finishing plate; at least one utility component configured for connection to associated utility equipment and to the adapter and having an outer surface; a retainer configured for attachment to the adapter; and a fascia having a substantially planar outer surface and configured for removable attachment to at least one of the at least one utility component and the retainer such that the outer surface of the at least one utility component and of the fascia are also flush with the finishing plane.

Another embodiment includes a method of mounting a utility component comprising directly attaching a mounting support to one or more internal structural support members; attaching wall material so as to cover the internal structural support members and partially cover the mounting support such that at least a portion of the mounting support remains exposed; attaching an adapter to the mounting support, the adapter comprising an outwardly extending annular flange defining a finishing plane and a finishing plate abutting and extending laterally from all sides of the annular flange such that a portion of the wall material is interposed between the mounting support and an inner surface of the finishing plate; applying finishing material on the wall material and on an outer surface of the finishing plate and an outer surface of the annular flange so as to be substantially flush with the finishing plane, the finishing plate having at least one structural feature configured to retain the finishing material; connecting at least one utility component having an outer surface to associated utility equipment; attaching the at least one utility component to the adapter; attaching a retainer to at least one of the at least one utility component and the adapter; and removably attaching a fascia having a substantially planar outer surface to at least one of the at least one utility component and the retainer such that the outer surface of the at least one utility component and of the fascia are also flush with the finishing plane.

DETAILED DESCRIPTION OF PREFERRED EMBODIMENTS

Figure 1:
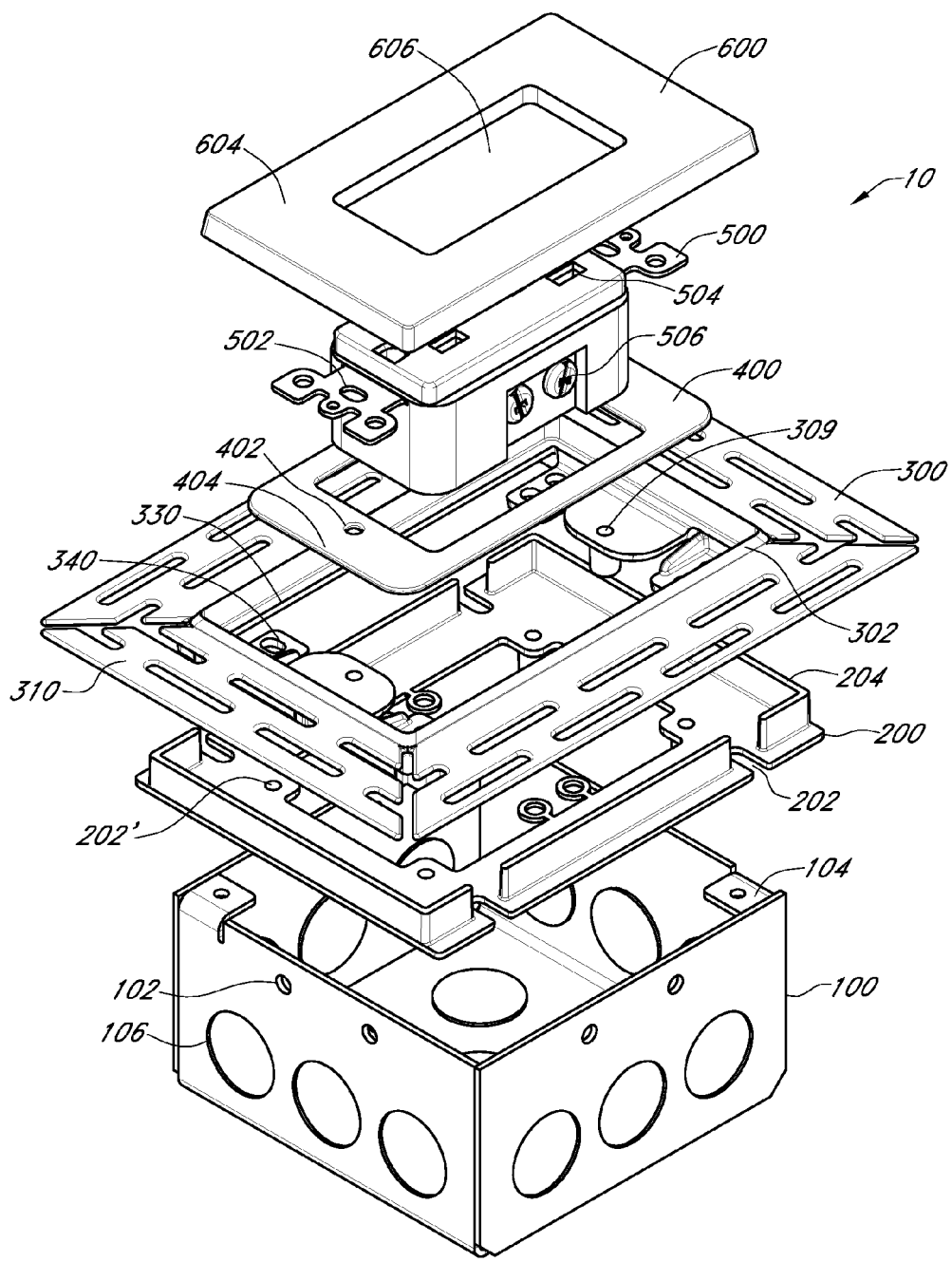
FIG. 1 is an exploded perspective view of one embodiment of a utility component mounting assembly.

Reference will now be made to the drawings where like reference designators designate like parts throughout. FIG. 1 is an exploded perspective view of one embodiment of utility component mounting assembly 10. The utility component mounting assembly 10 is configured to provide an access connection for associated utility services and/or to provide control and/or monitoring functionality for associated utilities or appliances. Some non-limiting examples of the functions provided by the utility component mounting assembly 10 include, but are not limited to, one or more gangs of electrical receptacles, switches, regulators or dimmers, keypads, monitoring displays, telephone jacks, GFI outlets, coaxial cable connections, fiberoptic cable connections, Universal Serial Bus (USB) hubs, charging stations, volume controls, channel controls, wireless transceivers, motion sensors, speakers, microphones, light sensors, cameras, and the like. Detailed description will be provided for embodiments directed to a particular utility component and function, however this is strictly for purposes of understanding of the structure and operation of the invention.

In the following detailed description, reference will be made to certain directions and/or orientations. The directions/orientations can be considered from the frame of reference of a generally flat or planar and vertically oriented wall of a building, where the wall can be an interior or exterior wall. The major visible surface of such a wall can be considered to define a wall plane. Unless otherwise noted, reference to "outwards/outwardly" and "inwards/inwardly" will indicate a direction generally perpendicular to the wall plane and directed away from and into the wall surface respectively.

Figure 2:
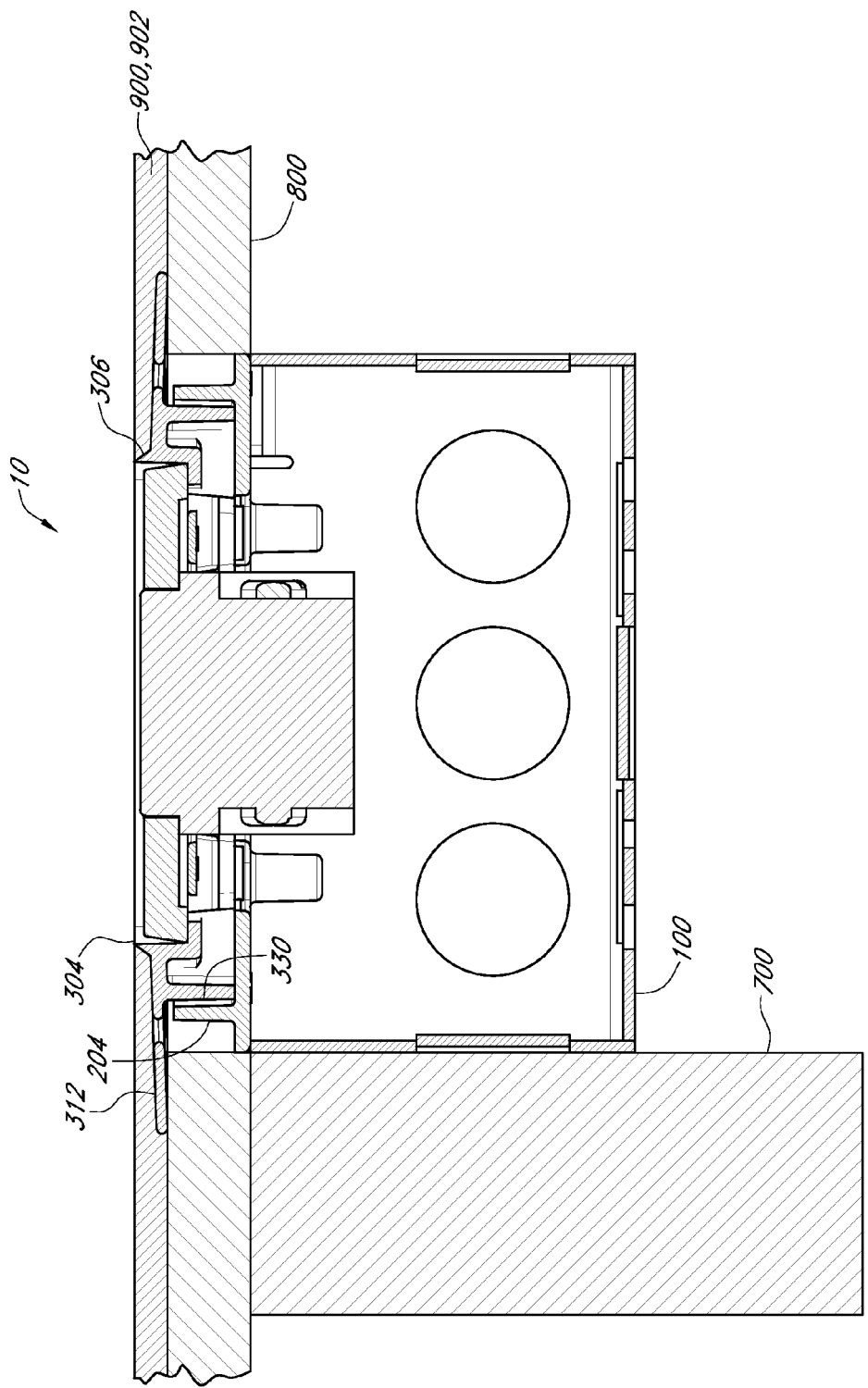
FIG. 2 is a section view of one embodiment of an installed and assembled utility component mounting assembly.

In one embodiment, a utility component mounting assembly 10 includes a mounting support 100. The mounting support 100 is configured to provide structural support and interconnection of component elements of the utility component mounting assembly 10. In one embodiment, the mounting support 100 is configured for attachment to one or more structural support members 700 (FIG. 2). The structural support members 700 provide physical support or a framework for new construction or remodeling construction of residential, commercial, or industrial buildings. The structural support members 700 generally comprise elongate semi-rigid members made of strong and durable materials such as wood, metal, or plastic and can be arranged in a vertical, horizontal or other orientation.

The mounting support 100 can include one or more first attachment structures 102 configured to facilitate attachment of the mounting support 100 to associated structural support members 700 in a vertical, horizontal, or other orientation and at a desired vertical height and horizontal displacement from other structures. In one embodiment, the first attachment structures 102 comprise pre-drilled or pre-formed openings to facilitate employment of various fastening elements and/or materials such as nails, screws, welds, adhesives, rivets, and the like. In one embodiment, the mounting support 100 also comprises one or more second attachment structures 104 configured for attachment of other components elements of the utility component mounting assembly 10 as will be described in greater detail below. In one embodiment, the mounting support 100 also comprises one or more utility accesses 106. The utility accesses 106 comprises pre-formed openings or weakened areas such that a desired utility access 106 portion of the mounting support 100 can be removed at installation to provide access for cabling, wiring, conduit, and the like. The mounting support 100 can be formed of various materials according to the requirements of particular applications, including but not limited to metal and plastic. In one embodiment, the mounting support 100 can comprise an existing component typically employed in building construction, such as a 4S stamped steel box.

In one embodiment, the utility component mounting assembly 10 also comprises a first adapter 200. The first adapter 200 is configured for attachment to an associated mounting support 100 and also for attachment to other component elements of the utility component mounting assembly 10 as will be described in greater detail below. In one embodiment, the first adapter 200 assumes a generally rectangular shape, generally matching shape and dimensions of an associated mounting support 100. In one embodiment, the first adapter 200 comprises one or more attachment structures 202 configured to facilitate attachment of the first adapter 200 to the mounting support 100 in a known manner. In one embodiment, the first adapter 200 further comprises an annular flange 204. In one embodiment, the annular flange 204 is an outwardly extending structure extending substantially completely about an outer periphery of the first adapter 200. In one embodiment, the annular flange 204 engages with matching structure of other component elements of the utility component mounting assembly 10 as will be described in greater detail below.

In one embodiment, the utility component mounting assembly 10 comprises a second or finishing adapter 300. The finishing adapter 300 is configured for attachment to at least an associated mounting support 100 and optionally also for attachment to other component elements of the utility component mounting assembly 10 as will be described in greater detail below. In one embodiment, the finishing adapter 300 comprises a first outwardly extending annular flange 302. The first annular flange 302 extends substantially completely about a perimeter of a central, generally rectangular opening of the finishing adapter 300 and, in one embodiment, comprises four adjoining outer surfaces 306 (FIG. 2) that are angled inwards or towards the central opening. In one embodiment, outermost edges of the first annular flange 302 of the finishing adapter 300 are substantially coplanar and define a finishing plane 304 that will be described in greater detail below with reference to FIG. 2.

Figure 3:
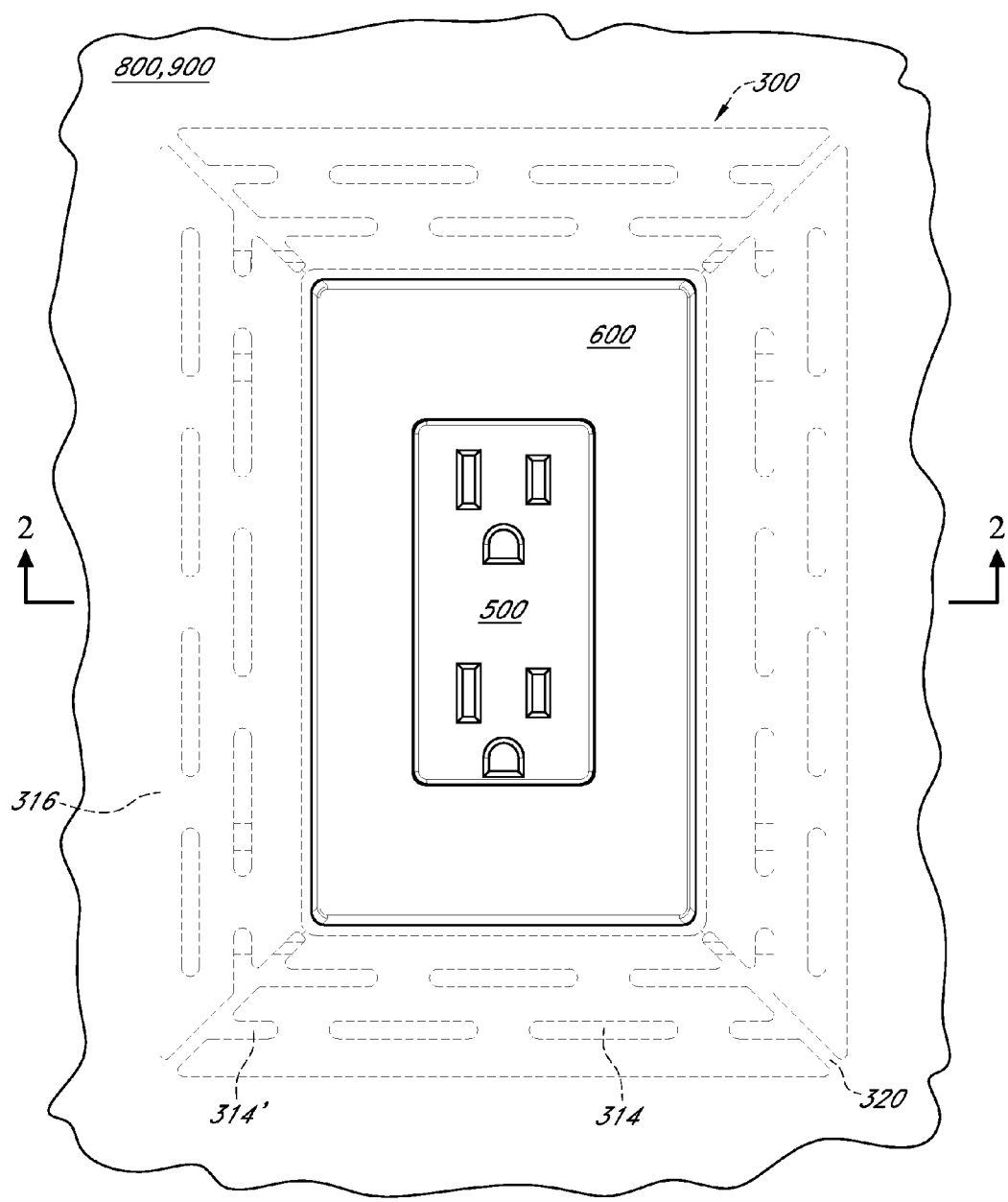
FIG. 3 is a front view of one embodiment of an installed utility component mounting assembly showing visible and hidden components thereof.

In one embodiment, the finishing adapter 300 also comprises a finishing plate 310. The finishing plate 310 extends generally laterally away from the first annular flange 302. The finishing plate 310 preferably extends in all lateral directions from the first annular flange 302, however this is not a requirement. The finishing plate 310 defines an outwardly facing outer surface 312 and comprises at least one and preferably a plurality of structural features 314 (FIG. 2). The structural features 314 are configured to facilitate application and retention of finishing material 900 (FIG. 2). In one embodiment the structural features 314 comprise one or more through holes extending from the outer surface 312 of the finishing plate 310 to an opposite inner surface. In one embodiment the structural features 314 comprise elongate holes. The structural features 314 can comprise closed holes 314 or open notches 314' as shown in FIG. 3. In one embodiment, the structural features 314, 314' comprise a plurality of elongate holes formed so as to extend generally parallel to adjacent structural features 314, 314' and to extend generally parallel to an adjacent edge 316 of the finishing plate 310.

In one embodiment, the finishing plate 310 comprises one or more relief structures 320 (FIG. 3). The relief structures 320 are configured to allow at least portions of the finishing plate 310 to bend or distort. In one embodiment, the relief structures 320 extend generally from the first annular flange 302 to an adjacent edge 316. In one embodiment, the finishing plate 310 comprises four relief structures 320 where each relief structure 320 extends from a respective corner of the first annular flange 302 to an adjacent corner of the finishing plate 310.

In one embodiment, the finishing adapter 300 further comprises a second annular flange 330. The second annular flange is configured to extend inwardly and substantially extend completely around the periphery of the central opening of the finishing adapter 300. The second annular flange is configured to engage with the annular flange 204 of the first adapter 200 in a manner that will be described in greater detail below with reference to the assembled/installed view of FIG. 2. In one embodiment the finishing adapter 300 also comprises one or more attachment structures 309 and/or 340 configured for attachment with other component elements of the utility component mounting assembly 10, such as the mounting support 10 and/or first adapter 200.

In one embodiment, the utility component mounting assembly 10 comprises a retainer 400. The retainer comprises at least one attachment structure 402 and at least one retaining structure 404. The retainer 400 is configured to be securely attached via the attachment structure 402 to at least some other component elements of the utility component mounting assembly 10, such as the mounting support 100, first adapter 200, and/or finishing or second adapter 300 and to releasably retain at least one other component element of the utility component mounting assembly 10 via the at least one retaining structure 404, as will be described in greater detail below.

In one embodiment, the utility component mounting assembly 10 comprises at least one utility component 500. The utility component 500 is configured to provide one or more useful utility, control, monitoring, or sensing function of the utility component mounting assembly 10 as previously described. In one embodiment as illustrated in FIG. 1, the utility component 500 comprises a single gang pair of electrical receptacles, however this is simply for illustrative purposes and is simply one preferred embodiment. The utility component 500 comprises at least one attachment structure 502 configured for secure attachment to at least some other component elements of the utility component mounting assembly 10. In one embodiment, the utility component 500 comprises one or more utility connections 506 which in one embodiment comprise receptacles for connection to electrical mains power and configured according to the requirements of a given application.

In one embodiment, the utility component mounting assembly 10 comprises a fascia or decorative face 600. The fascia 600 is configured to partially cover and protect internal structure and components of the utility component mounting assembly 10, including at least portions of the utility component 500. In one embodiment the fascia 600 comprises one or more retaining structures 602. The retaining structures 602 are configured to releasably engage with corresponding structures of the utility component mounting assembly 10, such as the retaining structures 404 of the retainer 400 so as to releasably retain the fascia 600 in an attached location, e.g as shown in FIGS. 2 and 3. In one embodiment, the fascia 600 defines an outer surface 604 and at least one utility component opening 606. The opening 606 is configured to provide access for the associated utility component 500. In the embodiment illustrated and described with respect to FIG. 1, the opening 606 provides access for a user to connect power cords to the utility connection 506 of the utility component 500. In other embodiments, the opening 606 provides clearance or access for sensor or display functionality of the utility component mounting assembly 10 and in yet other embodiments the opening 606 provides access for user manipulation of control functionality of the utility component mounting assembly 10.

FIG. 2 illustrates a section view of an embodiment of the utility component mounting assembly 10 in an assembled and installed condition. In one embodiment, the mounting support 100 of the utility component mounting assembly 10 is attached to at least one structural support member 700. As previously noted, the structural support members 700 provide at least a portion of the physical support for a building in new construction or in remodeling. The mounting support 100 can be attached to the structural support member 700 in any manner according to the requirements of particular applications.

FIG. 2 also illustrates that in one embodiment, one or more sheets of wall material 800 are secured to the structural support members 700. In one embodiment, the wall material 700 can comprise conventional sheet rock or drywall material. In some embodiments, the wall material 700 can be available in different thickness and a particular thickness can be selected according to the requirements of the particular application. In one embodiment, the annular flange 204 of the first adapter 200 and the second annular flange 330 of the finishing adapter 300 mutually engage in an overlapping or telescoping configuration. In one aspect, embodiments provide the ability to accommodate varying thicknesses of wall material 700 via varying degree of mutual overlap between the annular flange 204 of the first adapter 200 and the second annular flange 330 of the finishing adapter 300. This aspect provides the advantage that the overlapping annular flange 204 and second annular flange 330 substantially cover an opening formed or provided in the wall material 800 to provide clearance for the utility component mounting assembly 10 while the interior of the utility component mounting assembly 10 is isolated from exposed surfaces of the wall material 700, while still accommodating a range of thicknesses of wall material 800.

In one embodiment, after the mounting support 100 is attached to the structural support member(s) 700 and wall material 800 is secured in place, remaining component elements of the utility component mounting assembly 10 can be located and assembled. In this embodiment, finishing material 900 can they be applied to the wall material and to portions of the utility component mounting assembly 10 such that the utility component mounting assembly 10 is mounted in a substantially flush manner. Finishing material 900, such as drywall mud or plaster can be applied over the outer surface of the wall material 700 and so as to cover an outer surface 312 of the finishing plate 310 of the finishing adapter 300. As the finishing material 900 is preferably a semi-liquid material upon application, the finishing material 900 will be forced into the structural features 314, 314'. Upon drying and/or hardening, the finishing material 900 will firmly engage with the multidimensional structural features 314, 314' to firmly bond the hardened finishing material 900 in the three-dimensional voids defined by the structural features 314, 314' of the finishing plate 310.

In some embodiments, finishing material 900 is preferably applied to a depth sufficient to cover the outer surface 306 of the annular flange 302 and such that an outer surface of the finishing material 900 is substantially flush or coplanar with the finishing plane 304. In one embodiment, the utility component mounting assembly 10 is configured such that the applied finishing material 900, an outer surface 504 of the utility component 500, and the outer surface 604 of the fascia 600 are all substantially coplanar or flush with the finishing plane 304. In this embodiment, in an installed state, there is little to no protrusion of any portion of the utility component mounting assembly 10 from the surrounding finishing material 900.

In one embodiment, additional second finishing material 902 can be applied after first finishing material 900. In one embodiment, second finishing material 902 comprising paint can be applied atop the first finishing material 900 and exposed surfaces of the utility component mounting assembly 10 while maintaining a substantially flush mounting configuration or co-planarity with the finishing plane 304. In another embodiment, second finishing material 902 comprising wall paper can be applied atop the first finishing material 900 and exposed surfaces of the utility component mounting assembly 10, again maintaining a substantially flush mounting configuration or co-planarity with the finishing plane 304.

FIG. 3 illustrates an embodiment of the utility component mounting assembly 10 in an installed and assembled configuration in top or front view. Solid lines indicate portions of the utility component mounting assembly 10 that would typically be visible, in one embodiment only the outer surface 504 of the utility component 500 and the outer surface 604 of the fascia 600. Ghost or broken lines illustrate portions of the utility component mounting assembly 10 that would normally be obscured, for example by finishing material 900, 902. In certain embodiments, the finishing material 900, 902 is preferably applied to substantially cover and flushly abut the outer surface 306 of the annular flange 302 and thus achieve co-planarity with the finishing plane 304. As may be seen in FIG. 3, an observer may discern a narrow gap between the outer edges of the fascia 600 and the annular flange 302. However, the only visible portions of the utility component mounting assembly 10 (namely the outer surface 504, 604 of the utility component 500 and fascia 600 respectively) are substantially flush with and finished in the same finishing material 902 as the remainder of the building wall. This aspect of the invention achieves a desirable unobtrusive and continuous appearance of the utility component mounting assembly 10 with little to no outward protrusion of any component thereof.

Figure 4:
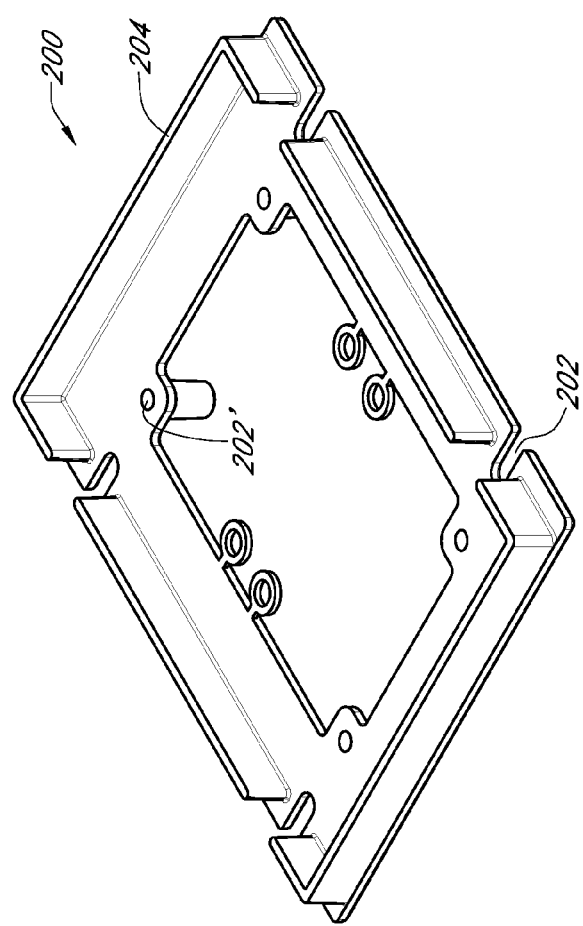
FIG. 4 is a perspective view of one embodiment of an adapter of one embodiment of a utility component mounting assembly configured for use with certain existing construction components.

FIG. 4 illustrates in greater detail a perspective view of an embodiment of the first adapter 200. In this embodiment, the first adapter 200 further comprises one or more attachment structures 202' configured for attachment of other component elements of the utility component mounting assembly 10, such as the finishing adapter 300. In this embodiment, the first adapter 200 is formed from plastic.

Figure 5:
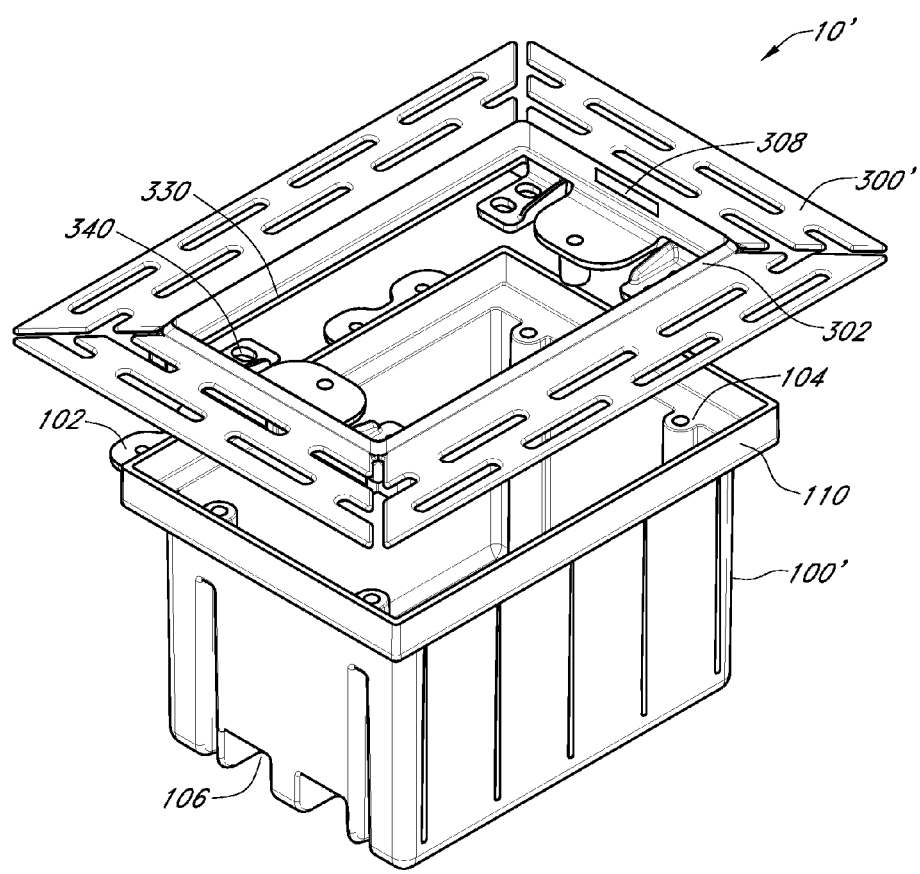
FIG. 5 is an exploded perspective view of another embodiment of a utility component mounting assembly.

FIG. 5 illustrates in exploded perspective view of another embodiment of utility component mounting assembly 10'. This embodiment is partially similar to the embodiments already described of the utility component mounting assembly 10 and similarities will not be repeated for brevity and ease of understanding. In this embodiment, the utility component mounting assembly 10' comprises a mounting support 100' and a finishing adapter 300'. In this embodiment, the mounting support 100' further comprises an annular flange 110. The annular flange 110 is similar in contour and function to the previously described annular flange 204 of the first adapter 200. However, in this embodiment, the annular flange 110 is formed as an integral part of the mounting support 100' rather than as a portion of a separate component, e.g. the first adapter 200. Thus, in one embodiment, the first adapter 200 is not required and the annular flange 110 of the mounting support 100' and the annular flange 330 of the finishing adapter 300' engage and function substantially as previously described for the annular flange 204 of the first adapter 200 and the annular flange 330 of the finishing adapter 300. Thus in one embodiment the finishing adapter 300' and mounting support 100' provide similar utility to the embodiments previously described comprising a composite or combined first adapter 200 and second or finishing adapter 300 in combination with the mounting support 100.

Figure 7:
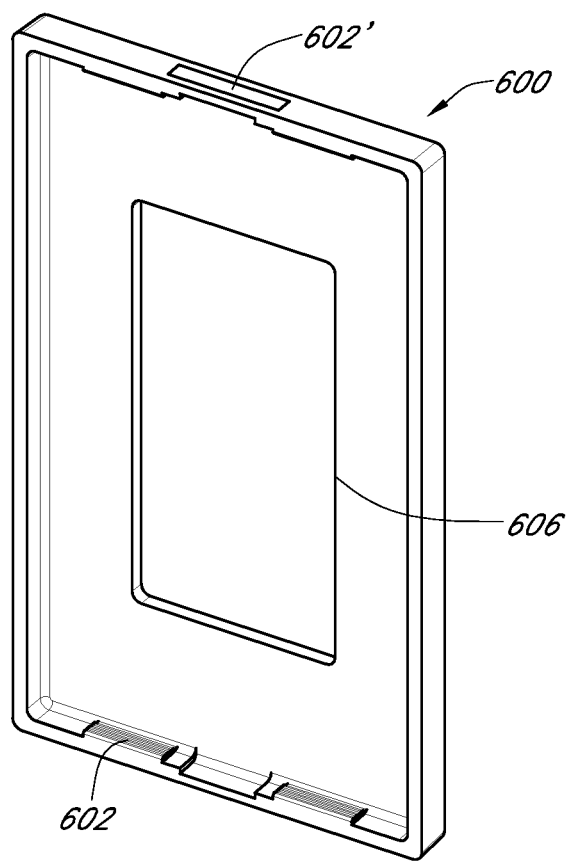
FIG. 7 is a rear perspective view of on embodiment of a fascia of an embodiment of a utility component mounting assembly configured for substantially flush mounting with respect to adjacent wall material.

A further difference of embodiments of the utility component mounting assembly 10' is that the finishing adapter 300' comprises one or more retaining structures 308. The retaining structures 308 cooperate with corresponding retaining structures 602 and/or 602' (FIG. 7) to releasably retain the fascia 600 in an attached configuration. It will be understood that the retaining structures 308, 602, 602' can operate as snap fit engagements, friction fit engagements, male/female engagements, releasable adhesive engagements, magnetic engagements, and any other suitable means for releasable engagement appropriate to the requirements of a given application.

Figure 6:
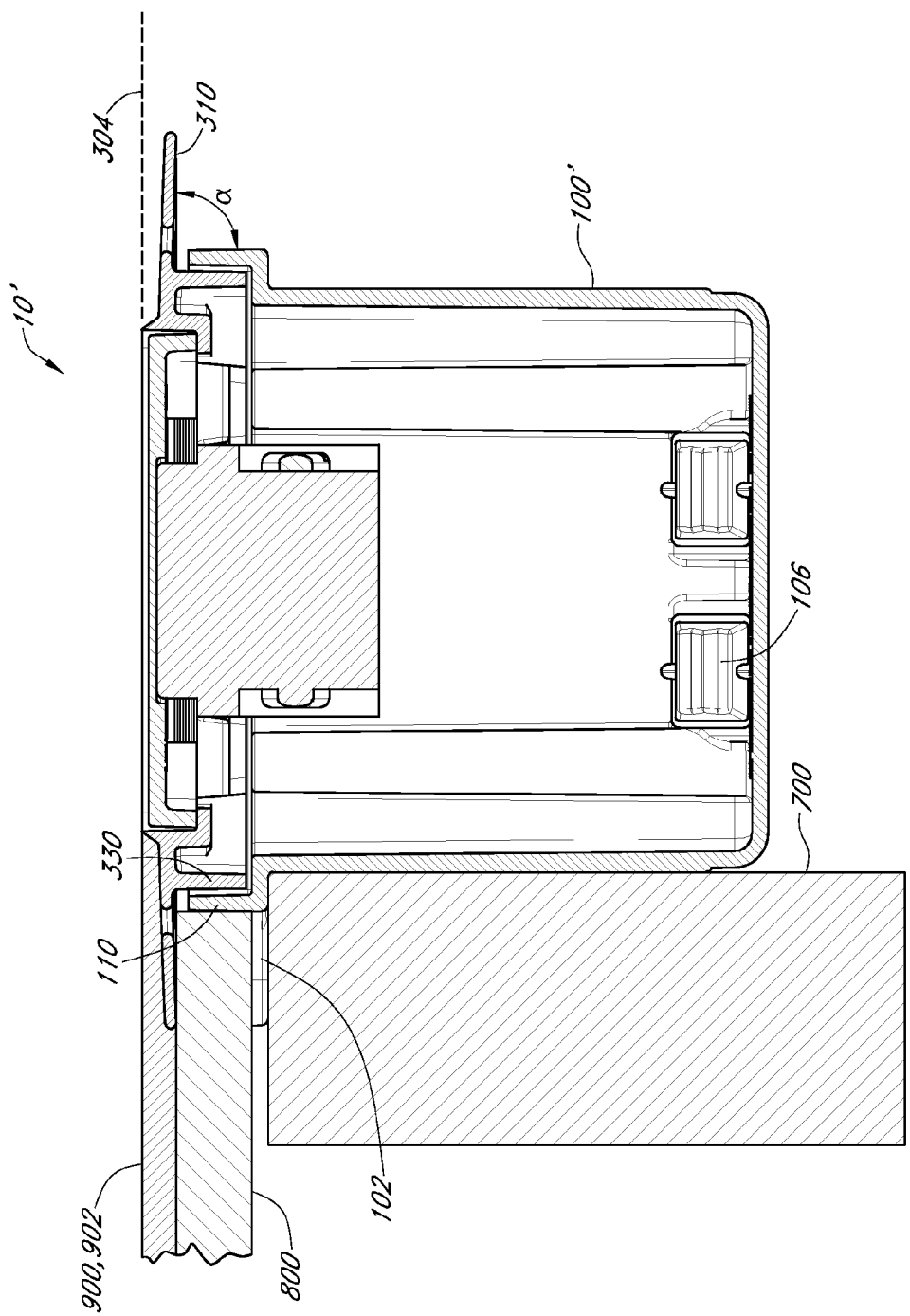
FIG. 6 is a section view of another embodiment of an installed and assembled utility component mounting assembly.

FIG. 6 illustrates a section view of an embodiment of the utility component mounting assembly 10' in an assembled and installed condition. FIG. 6 also illustrates schematically that in some embodiments, one or more portions of the finishing plate 310 can assume a depending angle α from the finishing plane 304 in a relaxed state. For example, in one embodiment, at least portions of the finishing plate 304 are formed of resilient or flexible material and, in a relaxed state, one or more sides of the finishing plate 310 extend inwards at the angle α from the finishing plane 304. Upon attachment of the finishing adapter 300' to the mounting support 100' or of the first adapter 200 and finishing adapter 300 to the mounting support 100, outer edges 316 and an inner surface of the finishing plate 310 resiliently bears against the adjacent outer surface of the wall material 800. This aspect of certain embodiments provides the advantage of more securely and closely mating the finishing plate 310 to the wall material 800, for example in cases where an installer may have imprecisely formed a clearance opening in the wall material 800 for the utility component mounting assembly 10, 10' and/or where the wall material 800 may have an uneven surface.

Figure 8:
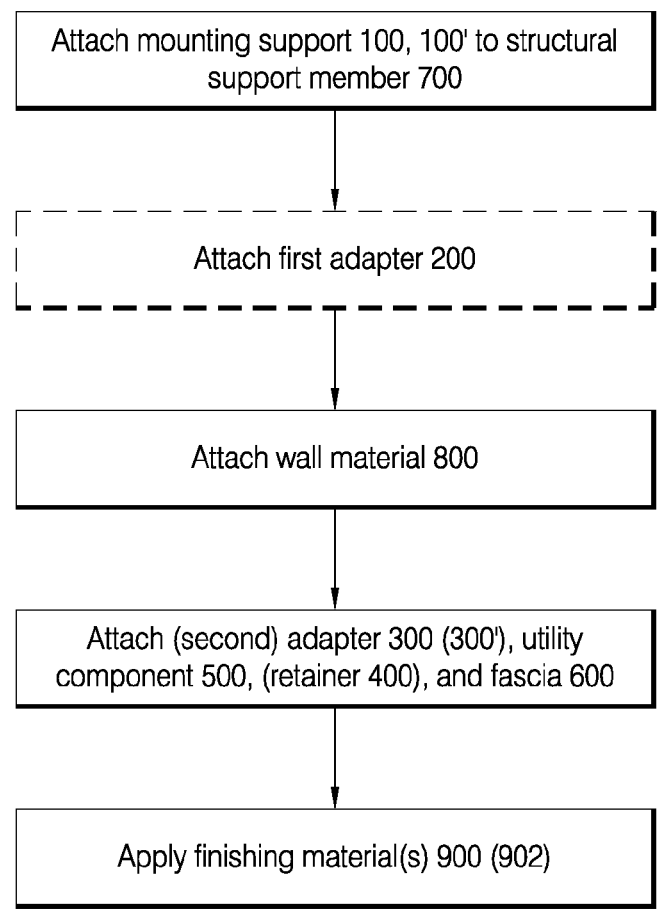
FIG. 8 is a flow chart of one embodiment of a method of installing embodiments of utility component mounting assemblies.

FIG. 8 is a flow chart of embodiments of assembly/installation methods of the previously described utility component mounting assembly 10, 10'. In a first step, an installer would attach a mounting support 100, 100' to a respective structural support member 700. As previously described, configurations of the mounting supports 100, 100' are configured to provide a wide degree of flexibility to the installer in installation location, orientation, and method. In embodiments employing the first adapter 200, the first adapter 200 is engaged with the mounting support 100. The first adapter 200 can be attached to the mounting support 100 or simply engaged in position and attached in a later step.

In a next step, wall material 800 is located and attached in position. As previously described, clearance holes or notches are generally required in the wall material 800 to provide access clearance for the utility component mounting assembly 10, 10'. Such clearance holes or notches can be preformed or formed at time of installation. This aspect provides additional flexibility in installation locations and orientations to accommodate the requirements of particular applications. In a next step, the finishing adapter 300 (300'), optionally the retainer 400, the utility component 500, and the fascia 600 are attached. As previously described, in some embodiments, installation of the utility component 500 will require additional connections, for example to a utility service, power source, etc. These additional connections and the establishment thereof will be well understood by the person of ordinary skill.

In a conclusory step, finishing material 900 is applied over the wall material 700 and portions of the utility component mounting assembly 10, 10'. As previously described, the finishing material 900 is preferably applied to achieve a substantially flush installation such that the finishing material 900 is substantially coplanar with the finishing plane 304. In some embodiments, one or more coats or layers of finishing material 902 would then be applied to achieve a desired color, finish, and appearance to the wall provided with an embodiment of the utility component mounting assembly 10, 10'.

Figure 9:
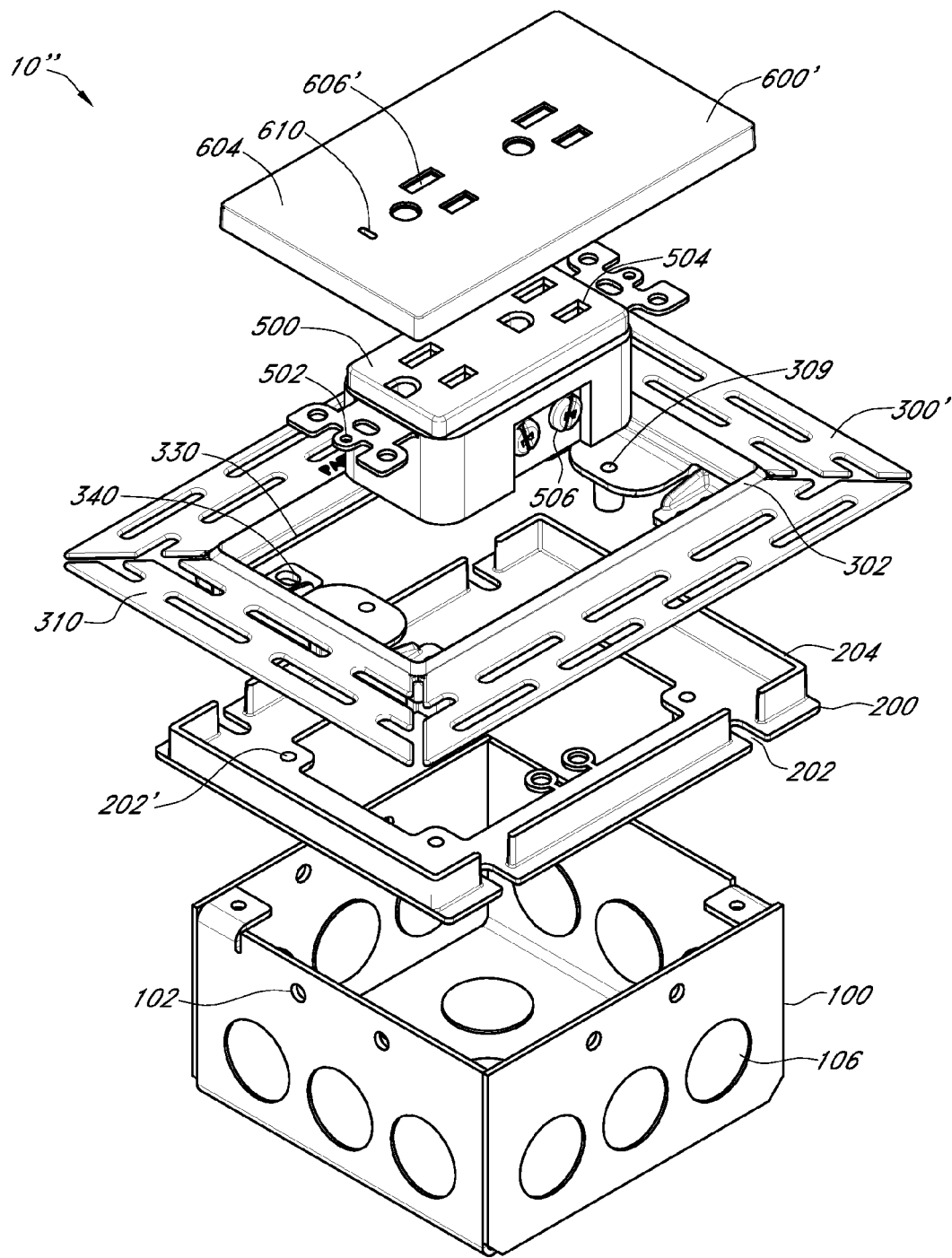
FIG. 9 is an exploded perspective view of another embodiment of a utility component mounting assembly.
Figure 10:
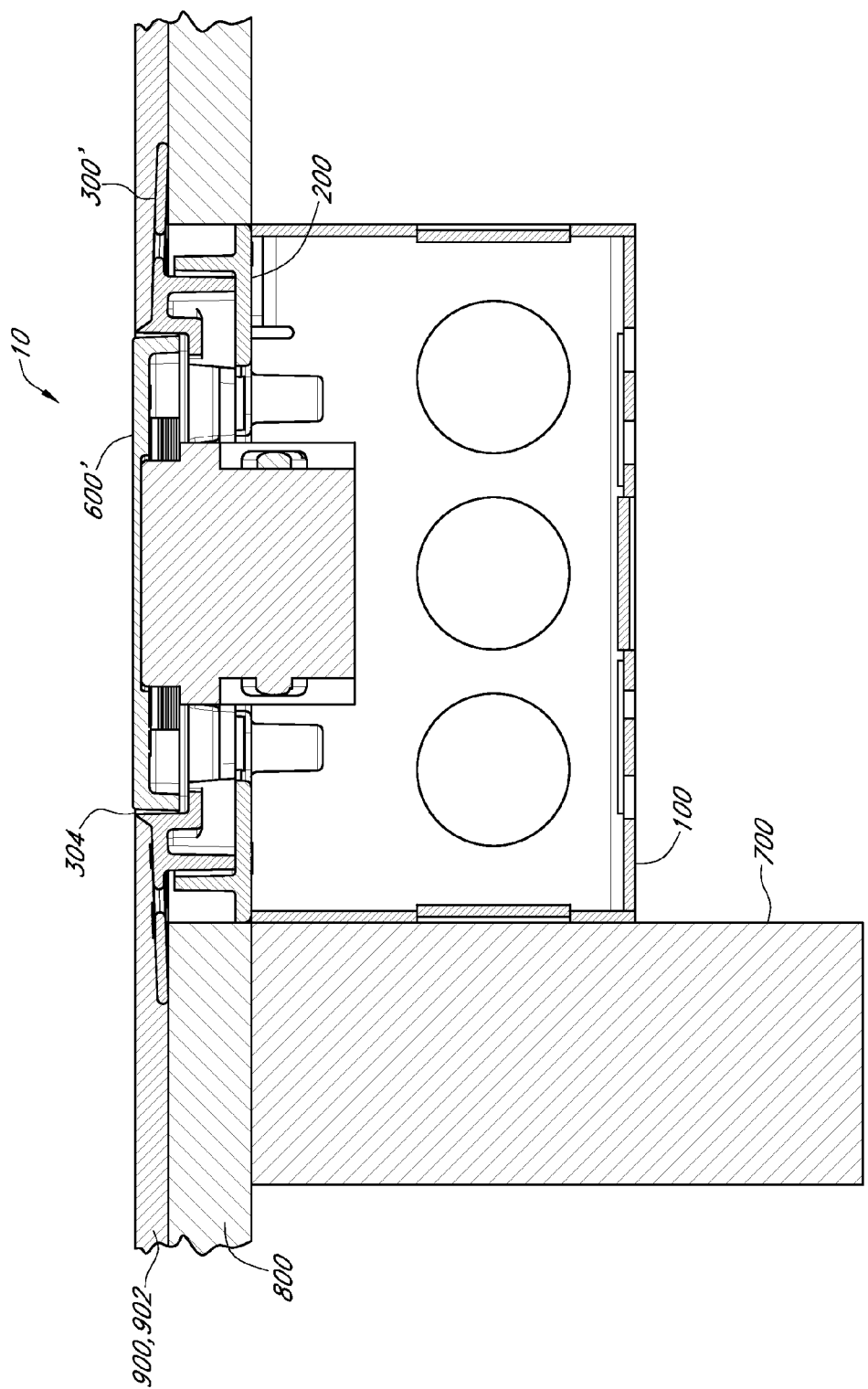
FIG. 10 is a section view of another embodiment of an installed and assembled utility component mounting assembly.
Figure 11:
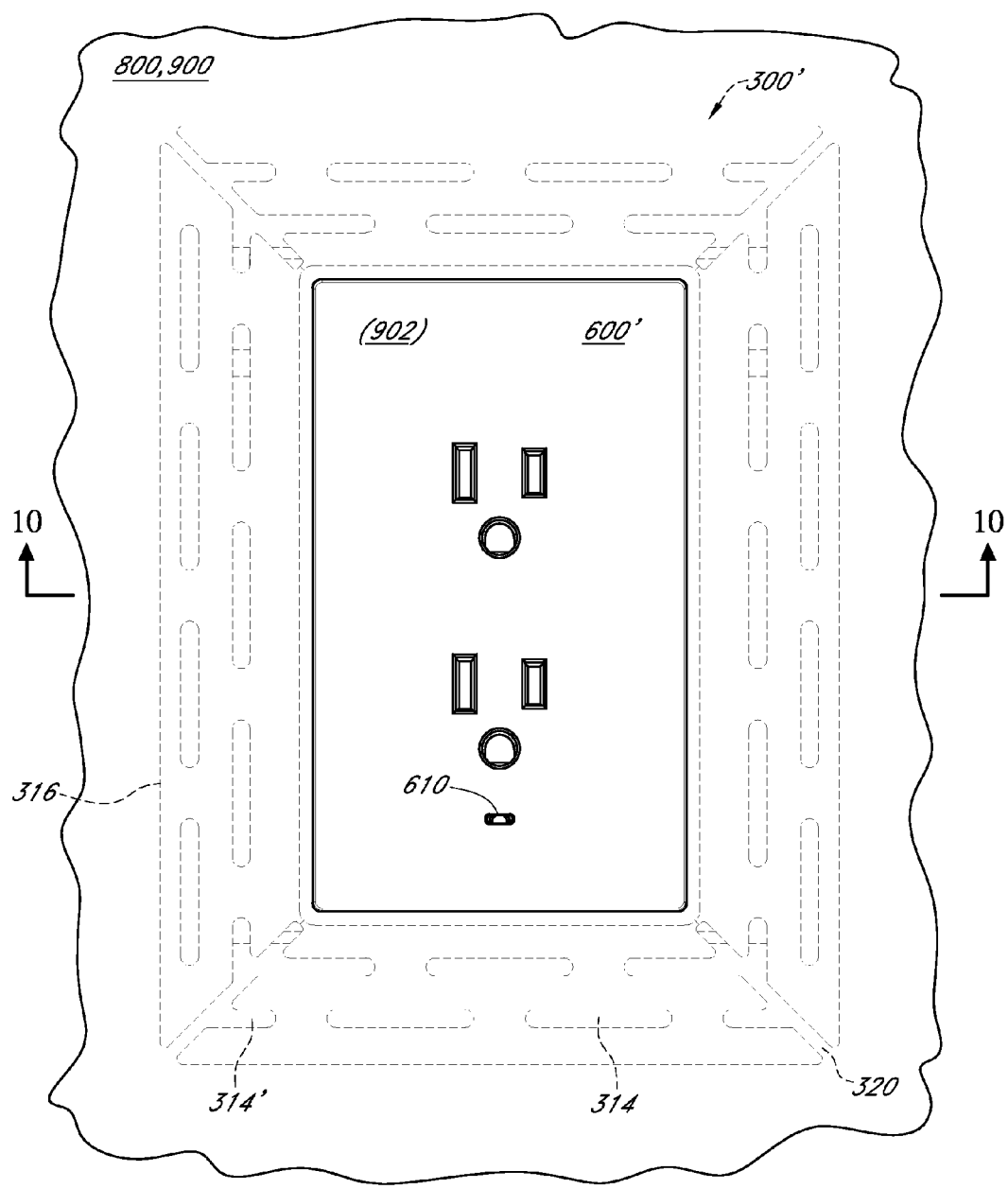
FIG. 11 is a front view of another embodiment of an installed utility component mounting assembly showing visible and hidden components thereof.

FIGS. 9-11 illustrate further embodiments of a utility component mounting assembly 10". The utility component mounting assembly 10" functions and installs in a similar manner to that previously described and illustrated for the embodiments of the utility component mounting assembly 10 and 10' and similarities will not be repeated for brevity and ease of understanding. The primary difference between the embodiments of the utility component mounting assembly 10 and 10' and embodiments of the utility component mounting assembly 10" are related primarily to embodiments of a fascia 600'. In some embodiments, the fascia 600' is configured to substantially cover the utility component 500 in an installed configuration. In one embodiment, the fascia 600' comprises a plurality of utility component openings 606'. The utility component openings 606' are configured to allow a user to connect equipment to the utility component 500 through the utility component openings 606'. In one embodiment, the fascia 600' also comprises a removal structure 610. The removal structure 610 is configured to receive a tool, such as a flat blade screw driver, such that a user can appropriately manipulate the tool with respect to the removal structure 610 to facilitate removal of the fascia 600'. In some embodiments, the removal structure 610 can also comprise a safety or release aspect, such that the fascia 600' cannot be readily removed without appropriately manipulating or releasing a safety or tab component to allow the fascia 600' to be detached from remaining component elements of the utility component mounting assembly 10".

In some aspects, the fascia 600' also substantially obscures the utility component 500 in an installed configuration, for example as can be seen in FIG. 11. As shown in FIG. 11, substantially the only portion of the utility component mounting assembly 10" that is visible in an installed and assembled configuration is the outer surface 604 of the fascia 600'. In other aspects, the utility component mounting assembly 10" provides similar advantages as the utility component mounting assembly 10 and 10'. For example, the outer surface 604 of the fascia 600' can be installed so as to be substantially flush with the finishing material 900, 902 and to be coplanar with the finishing plane 304. Similarly, the fascia 600' can be provided with the finishing material 902 such that the utility component mounting assembly 10" adopts substantially the same exterior appearance as adjacent wall surfaces.

What is claimed is:

1. A utility component mounting assembly comprising:
   a mounting support configured for attachment to one or more internal structural support members;
   an adapter configured for attachment to the mounting support and comprising:
   an outwardly extending annular flange defining a finishing plane and
   a finishing plate abutting and extending laterally from the annular flange such that, in combination, the annular flange and finishing plate provide clearance for application of finishing material on an outer surface of the finishing plate and to an outer surface of the annular flange so as to be substantially flush with the finishing plane, the finishing plate having at least one structural feature configured to retain the finishing material and such that the adapter provides clearance for a sheet of wall material to be interposed between the mounting support and an inner surface of the finishing plate;

at least one utility component configured for connection to associated utility equipment and to at least one of the adapter and the mounting support and having an outer surface; and a fascia having a substantially planar outer surface and configured for removable attachment to at least one of the at least one utility component and the adapter such that the outer surface of the at least one utility component and of the fascia are also flush with the finishing plane.

2. The assembly of claim 1, further comprising a retainer configured for attachment to at least one of the adapter and the mounting support and further configured for removable attachment to the fascia.

3. The assembly of claim 1, wherein the at least one structural feature comprises a plurality of through openings extending from the outer surface of the finishing plate to the inner surface of the finishing plate.

4. The assembly of claim 3, wherein the through openings are elongate.

5. The assembly of claim 4, wherein the plurality of through openings are formed in the finishing plate between each side of the annular flange and the respective edge of the finishing plate so as to be mutually parallel each other.

6. The assembly of claim 1, wherein the finishing plate further comprises at least one relief structure to allow at least a portion of the finishing plate to be deformed from alignment with a remainder of the finishing plate.

7. The assembly of claim 6, wherein the at least one relief structure comprises a clearance cut formed to extend substantially from the annular flange to an edge of the finishing plate.

8. The assembly of claim 7, wherein the clearance cut is formed to extend substantially from a corner of the annular flange to an adjacent corner of the finishing plate.

9. The assembly of claim 1, wherein at least the finishing plate is formed of resilient material and wherein the finishing plate is formed to extend at an angle away from the finishing plane such that, upon attachment of the adapter, the finishing plate deforms and resiliently engages an outer surface of the wall material.

10. The assembly of claim 1, wherein the outer surface of the annular flange comprises outwardly extending wall surfaces and wherein the wall surfaces of the annular flange are angled away from perpendicular with the finishing plane.

11. The assembly of claim 1, wherein the adapter is a composite component comprising a first adapter configured for direct attachment to the mounting support and a second finishing adapter configured for attachment to the first adapter and comprising the outwardly extending annular flange defining the finishing plane and the finishing plate.

12. The assembly of claim 11, wherein the first adapter and the second finishing adapter are configured to telescopically engage with each other so as to provide clearance for varying thicknesses of wall material and so as to cover opening surfaces of an opening defined in the wall material through which at least one of the first and second adapters extend.

13. A utility component mounting assembly comprising:

a mounting support configured for attachment to one or more internal structural support members;

an adapter configured for attachment to the mounting support and comprising:
  an outwardly extending annular flange defining a finishing plane and
  a finishing plate abutting and extending laterally from the annular flange such that, in combination, the annular flange and finishing plate provide clearance for application of finishing material on an outer surface of the finishing plate and to an outer surface of the annular flange so as to be substantially flush with the finishing plane, the finishing plate having at least one structural feature configured to retain the finishing material and such that the adapter provides clearance for a sheet of wall material to be interposed between the mounting support and an inner surface of the finishing plate;

at least one utility component configured for connection to associated utility equipment and to at least one of the adapter and the mounting support; and a fascia having a substantially planar outer surface configured to substantially cover the at least one utility component and configured for removable attachment to at least one of the at least one utility component and the adapter such that the outer surface of the fascia is flush with the finishing plane.

14. A method of mounting a utility component comprising:

directly attaching a mounting support to one or more internal structural support members;

attaching wall material so as to cover the internal structural support members and partially cover the mounting support such that at least a portion of the mounting support remains exposed;

attaching an adapter to the mounting support, the adapter comprising an outwardly extending annular flange defining a finishing plane and a finishing plate abutting and extending laterally from all sides of the annular flange such that a portion of the wall material is interposed between the mounting support and an inner surface of the finishing plate;

applying finishing material on the wall material and on an outer surface of the finishing plate and an outer surface of the annular flange so as to be substantially flush with the finishing plane, the finishing plate having at least one structural feature configured to retain the finishing material;

connecting at least one utility component having an outer surface to associated utility equipment;

attaching the at least one utility component to the adapter; and removably attaching a fascia having a substantially planar outer surface such that the outer surface of the at least one utility component and of the fascia are also flush with the finishing plane.

15. The method of claim 1, wherein the finishing plate further comprises at least one relief structure, the method further comprising deforming at least a portion of the finishing plate from alignment with a remainder of the finishing plate before applying the finishing material.

16. The method of claim 15, wherein the at least one relief structure comprises a clearance cut formed to extend substantially from a corner of the annular flange to an adjacent corner of an edge of the finishing plate, the method further comprising deforming at least one edge of the finishing plate from alignment with a remainder of the finishing plate before applying the finishing material.

17. The method of claim 14, wherein at least the finishing plate is formed of resilient material and wherein the finishing plate is formed to extend at an angle away from the finishing plane such that, upon attachment of the adapter, the finishing plate deforms and resiliently engages an outer surface of the wall material.

18. The method of claim 14, further comprising attaching a retainer to at least one of the at least one utility component and the adapter and removably attaching the fascia to the retainer.

19. The method of claim 14, wherein applying the finishing material on the outer surface of the finishing plate and to the outer surface of the annular flange comprises applying first finishing material and further comprising subsequently applying second finishing material to the previously applied first finishing material and to the outer surface of the at least one utility component and of the fascia such that the second finishing material assumes a substantially uniform appearance and contour across the first finishing material and the outer surface of the at least one utility component and of the fascia.

20. The method of claim 14, wherein the adapter is a composite component comprising a first adapter configured for direct attachment to the mounting support and a second finishing adapter configured for attachment to the first adapter and comprising the outwardly extending annular flange defining the finishing plane and the finishing plate, the method further comprising:

attaching the first adapter to the mounting support;

attaching wall material so as to cover the internal structural support members and partially cover the mounting support and the first adapter such that at least a portion of the mounting support and first adapter remain exposed; and attaching the second finishing adapter to the first adapter, such that a portion of the wall material is interposed between the mounting support and an inner surface of the finishing plate.

\* \* \* \* \*